United States Patent
Di Dio

(10) Patent No.: US 7,064,075 B2
(45) Date of Patent: Jun. 20, 2006

(54) METHOD FOR MANUFACTURING SEMICONDUCTOR ELECTRONICS DEVICES

(75) Inventor: Luigi Di Dio, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/666,918

(22) Filed: Sep. 18, 2003

(65) Prior Publication Data
US 2004/0152329 A1    Aug. 5, 2004

(30) Foreign Application Priority Data
Sep. 18, 2002    (IT)    .......................... MI2002A1985

(51) Int. Cl.
*H01L 21/302*    (2006.01)
*H01L 21/461*    (2006.01)

(52) U.S. Cl. ........................ 438/710; 438/744; 438/785

(58) Field of Classification Search ................. 438/585, 438/627, 682, 687, 698, 710, 734, 744, 785
See application file for complete search history.

(56) References Cited

U.S. PATENT DOCUMENTS

| | | | | |
|---|---|---|---|---|
| 6,004,843 A | * | 12/1999 | Huang | 438/241 |
| 6,121,123 A | * | 9/2000 | Lyons et al. | 438/585 |
| 6,251,774 B1 | * | 6/2001 | Harada et al. | 438/637 |
| 6,342,448 B1 | * | 1/2002 | Lin et al. | 438/687 |
| 2004/0041272 A1 | * | 3/2004 | Signorini | 257/774 |
| 2005/0110152 A1 | * | 5/2005 | Wang et al. | 257/760 |

* cited by examiner

*Primary Examiner*—Phuc T. Dang
(74) *Attorney, Agent, or Firm*—Lisa K. Jorgenson; Hai Han; Seed IP Law Group PLLC

(57) ABSTRACT

A method is described for manufacturing electronic semiconductor devices comprising the steps of depositing in sequence a layer of hydrophobic material and a "deep UV" photo-resist layer on a semiconductor substrate, selectively removing the "deep UV" photo-resist layer and hydrophobic material in order to expose definite portions of the semiconductor substrate and etch the exposed portions by means of an watery acid solution. This method allows semiconductor devices to be manufactured, also having very critical sizes and with a convenient resolution and control of circuit patterns formed thereon through etching with watery acid solutions.

21 Claims, 2 Drawing Sheets

METHOD FOR MANUFACTURING SEMICONDUCTOR ELECTRONICS DEVICES

BACKGROUND OF THE INVENTION

1. Field of the Invention

In its more general aspect, the present invention relates to manufacturing electronic semiconductor devices.

More particularly, the present invention relates to a method for manufacturing electronic semiconductor devices by providing circuit patterns on a semiconductor substrate through either engraving or etching of said substrate with watery acid solutions.

2. Description of the Related Art

As it is well known, one of the fundamental technological steps for manufacturing electronic semiconductor devices is manufacturing circuit configurations or patterns on a semiconductor substrate.

At this purpose, a photo-resist layer is deposited on the semiconductor substrate and it is afterwards selectively removed, through traditional photolithography, in order to expose portions of said substrate according to a defined geometry corresponding to the desired circuit pattern. Then, the substrate is selectively etched in correspondence with the exposed portions in order to transfer the defined geometry from the photo-resist layer to one or more underlying semiconductor substrate layers.

In an embodiment of this method, according to the typology and features to be assigned to the final product, it can be convenient or necessary to manufacture circuit patterns on a semiconductor substrate by etching it with watery solutions containing acids. In this case, a photo-resist material of the so-called "i-line" type is generally applied in advance on the semiconductor substrate, i.e., a photo-resist material for which the exposure to wavelengths (λ) of about 365 nm in the common photolithographic development is provided.

Although advantageous under many aspects, this embodiment has the drawback that through the photolithographic development applied to the "i-line" photo-resist material it is impossible to control adequately the layout, overlay and current density features to be obtained in the final electronic device if the latter must be manufactured with very reduced submicromic size and thus with very thick circuit structures.

However it is known how microelectronics, for several years, has undergone a general trend providing a steady reduction of semiconductor device sizes and consequently a continuous thickening of the various circuit structures forming them.

According to this more and more urgent need, methods for manufacturing electronic semiconductor devices have been thus developed in the prior art, which provide, in the domain of circuit pattern manufacturing, the use of so-called "deep UV" photo-resist materials instead of common "i-line" photo-resist materials, whose exposure during the common photolithographic development is performed in the far ultraviolet ($\lambda$=248 nm).

The use of "deep-UV" photo-resist materials allows innovative equipment to be used, particularly photo-resist exposure machines operating in the far ultraviolet, through which an adequate layout, overlay and current density control can be obtained, even when manufacturing electronic semiconductor devices having a very critical submicrometric size.

Although advantageous under many aspects, these methods have however the drawback of being scarcely usable when in the production line an etching of the semiconductor substrate is provided with acid, watery solutions in correspondence with the exposed portions thereof by selectively removing the "deep-UV" photo-resist material previously applied thereon.

In fact it has been verified that when particularly aggressive watery acid solutions are used for etching the semiconductor substrate, a loss of adhesion between the "Deep UV" photo-resist layer and the substrate to be etched disadvantageously occurs, and subsequently the etching reaction can occur also in the unexposed areas of the semiconductor substrate at the interface with the above photo-resist layer.

The causes determining this loss of adhesion must be mainly searched in the "deep UV" photo-resist material own features and in the relevant photolithographic development process, as well as in the semiconductor substrate hydrophilicity.

In fact, as it is well known, a "deep UV" photo-resist material essentially comprises a resin containing protective groups which can be removed by means of an acid, a photosensitive compound effective to generate an acid when exposed to an ultraviolet radiation (Photo Acid Generator—PAG) and a solvent.

The adhesion between the photo-resist material and the substrate is mainly due to the interaction between the polar groups of the resin and those of the substrate.

The polar groups of the resin, which generally consists of a poly-hydroxy-styrene derivative, are essentially composed of a limited number of free hydroxyl groups (—OH) and in large part of carbonate groups ($OCO_2$) of the protective groups (for example ter-butyl-carbonate) used to block some resin hydroxyl groups in order to make it essentially insoluble in watery solutions.

During the common photolithographic development, the substrate whereon the "deep UV" photo-resist material has been applied and adhered is selectively exposed, through a convenient mask, to ultraviolet radiation and it thus undergoes a baking step (Post Exposure Bake—PEB) and a development step.

During the exposure, the photo-resist compound generates ions $H^+$ (acid), which in the baking step remove in the exposed areas the resin protective groups (in this specific case by etching the group $OCO_2$) generating a soluble compound in a basic solution used for the development step. FIG. 1 shows a reaction diagram concerning the above-described photolithographic process.

Now, since the reaction between ions $H^+$ and resin protective groups can partially occur also at room temperature, when very aggressive acid solutions are used for etching the substrate after the photolithographic process, it may occur that the photo-resist material on substrate unexposed areas is etched by the ions $H^+$ of the acid solution being used, and the resin carbonate polar groups are subsequently partially or totally removed in the same way as shown in the reaction diagram of FIG. 1.

Therefore, the resin deprived of the carbonate polar groups would no more be able to adhere efficiently to the substrate and, thus, the substrate etching can also extend to the regions thereof being unexposed to the photolithographic process.

Moreover, it must be noted that the substrate etching in unexposed regions is further favored by the semiconductor substrate hydrophilicity which favors the diffusion of the acid solution at the interface between the substrate and the photo-resist material.

All this clearly involves an inadequate control of the size of the circuit patterns formed on the semiconductor substrate, to the total detriment of the functionality and reliability of final electronic semiconductor devices which are unsatisfactory mainly when these devices are manufactured with very reduced size.

In prior art it has been tried to improve the adhesion between the "deep UV" photo-resist materials and the substrate by treating surface of the latter with hexamethyidysilazane (HMDS). Nevertheless, this treatment is ineffective when, after the "deep UV" photo-resist material development, the substrate is chemically etched with very aggressive watery acid solutions.

BRIEF SUMMARY OF THE INVENTION

An embodiment of the present invention provides a method for manufacturing electronic semiconductor devices by providing circuit patterns on a semiconductor substrate through either engraving or etching of said substrate with watery acid solutions., overcoming the above-mentioned prior art drawbacks.

The method includes the steps of:
depositing a layer of hydrophobic material on a substrate;
depositing a "deep UV" photo-resist layer on the layer of hydrophobic material,
selectively removing the "deep UV" photo-resist layer in order to form at least an opening therein and expose at least a portion of the hydrophobic material,
selectively removing the hydrophobic material in correspondence with at least an exposed portion thereof in order to expose at least a portion of the substrate,
etching said substrate in correspondence with said at least one exposed portion thereof through chemical etching with watery acid solutions,
removing the layer of hydrophobic material and the "deep UV" photo-resist layer from the unexposed portions of the semiconductor substrate.

The present invention is based on the remarkable finding that interposing a layer of hydrophobic material between the substrate and the "deep UV" photo-resist material avoids adhesion problems between the latter in the subsequent substrate etching with an watery acid solution while, in the meantime, due to the scarce "wettability" of the hydrophobic material, the acid solution diffusion in the substrate areas being unexposed to acid etching is also prevented.

Further features and advantages of the present invention will be more apparent from the following description of an embodiment thereof given by way of non-limiting example with reference to the attached drawings.

DETAILED DESCRIPTION OF THE INVENTION

The process steps described hereinafter do not form a complete process flow for manufacturing electronic semiconductor devices. The present invention can be implemented together with the electronic semiconductor device manufacturing techniques presently used in this field, and only the commonly used process steps being necessary to understand the present invention are included in the description.

Figure 2:
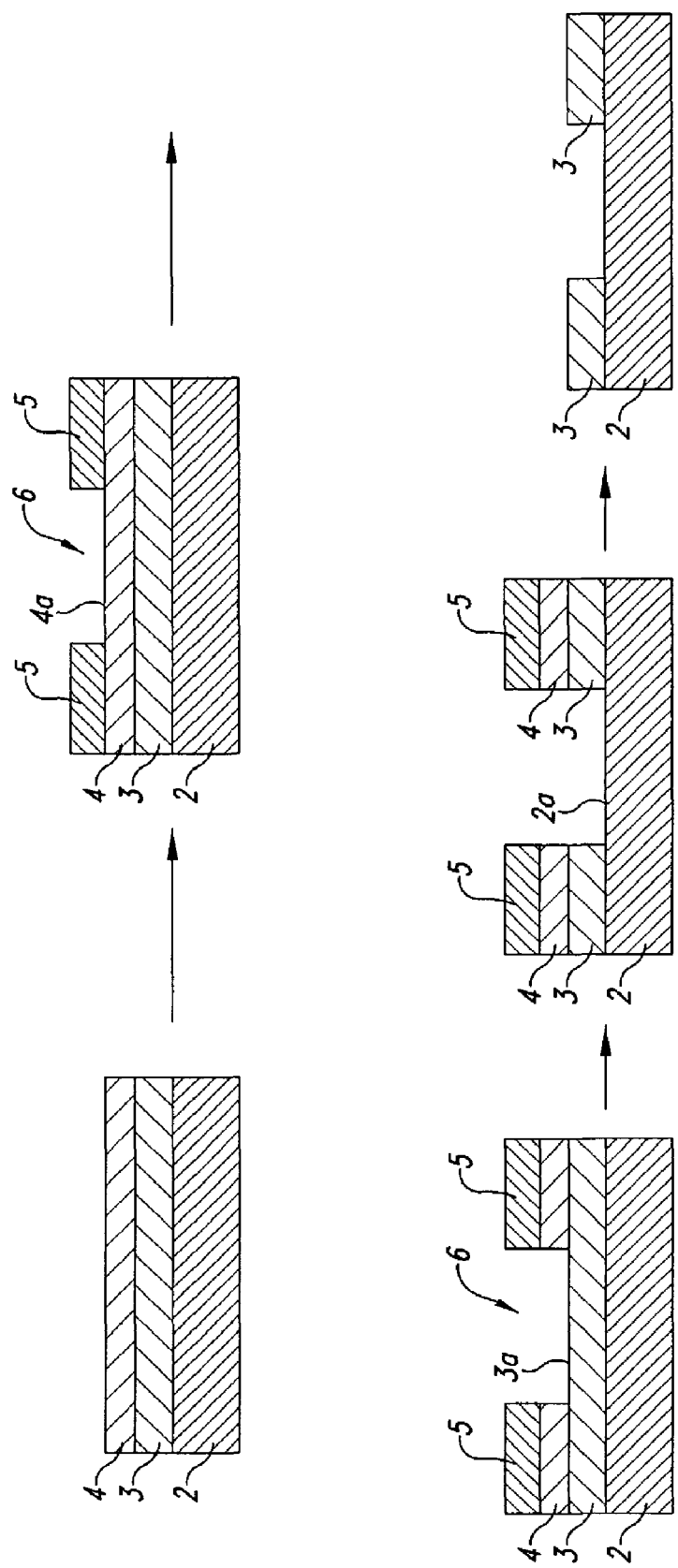
FIG. 2 shows cross sections of an electronic semiconductor device portion during the following steps of the method according to the present invention.

The electronic semiconductor device portion shown in FIG. 2 in the different manufacturing steps is not drawn to scale but only schematically in order to show features of the present invention.

With reference to FIG. 2, a portion of a semiconductor device is shown, the device having a layered circuit structure comprising a lower substrate 2 and an upper substrate 3 to be defined by etching with watery acid solutions.

The term substrate is used in this case to indicate any layer of semiconductor material, for example silicon. In particular, the term "substrate to be defined" means hereinafter the substrate whereon circuit patterns are to be formed through chemical etching thereof with watery acid solutions.

In the method, first a layer of hydrophobic material 4 is deposited on the upper substrate 3 to be defined and then a "deep UV" photo-resist layer 5 is deposited on the hydrophobic material layer 4.

Figure 1:
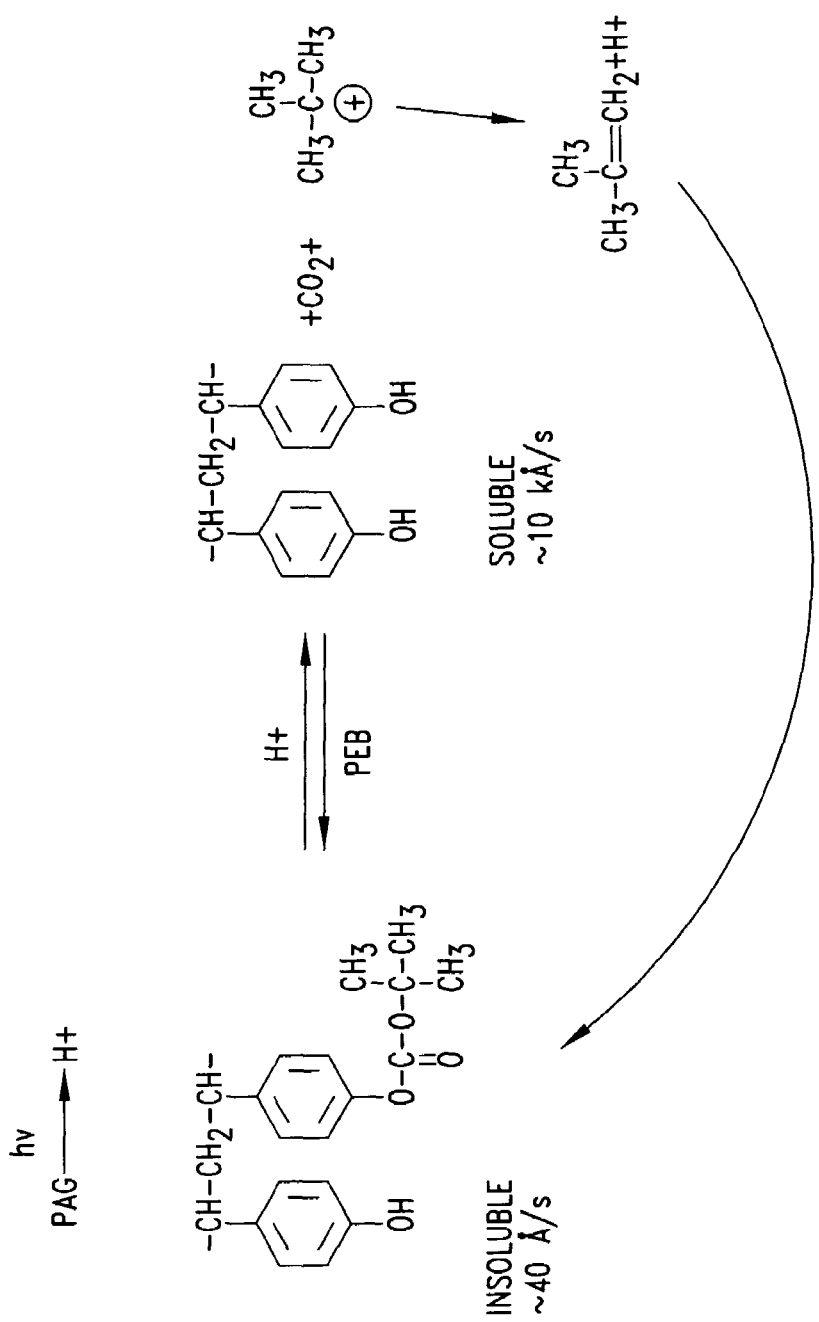
FIG. 1 is a reaction diagram concerning a photolithographic development process of a "deep UV" photo-resist material used in the method according to the present invention.

Then the "deep UV" photo-resist layer 5 is selectively removed through traditional photolithographic techniques according to the photo-resist material development reaction diagram shown in FIG. 1.

The selective removal of the "deep UV" photo-resist layer 5 allows openings 6 to be formed therein (FIG. 2 shows for simplicity only one of these openings) in order to expose corresponding portions 4a of the hydrophobic material 4. A circuit pattern to be defined on the upper substrate 3 corresponds to these openings.

Afterwards, the selective removal of the hydrophobic material 4 is performed in correspondence with the exposed portions 4a through traditional techniques. Openings 6 are therefore vertically extended in the hydrophobic material layer 4 up to expose portions 3a of the upper substrate 3 to be defined.

At this point, the circuit pattern defined by openings 6 in the hydrophobic material layer 4 and in the "deep UV" photo-resist layer 5 is transferred in the upper substrate 3. This transfer is performed by chemically etching with watery acid solutions the exposed portions 3a of the upper substrate 3 to be defined in order to expose portions 2a of the lower substrate 2. Therefore, being the upper substrate 3 now defined, the removal of the "deep UV" photo-resist layer 5 and of the underlying hydrophobic material layer 4 on unexposed portions of the already defined upper substrate 3 is performed in a traditional way.

The hydrophobic material can be any material capable of adhering efficiently to the semiconductor substrate and to the "deep UV" photo-resist layer and of preventing the acid solution from diffusing during the semiconductor substrate etching in areas or portions thereof being unexposed to this etching.

Hydrophobic materials suitable for this purpose can be chosen from the group comprising a polymeric organic material, essentially composed of a polymethylmetacrylate, known as BARC (Bottom Antireflection Coating), polytetrafluoroethylene, polyethylene, polystyrene and polyvinyl chloride. Preferably, the layer thickness of these hydrophobic materials can vary from 300 to 1600 Å.

The most preferred hydrophobic material is BARC. Generally, in the domain of semiconductor devices manufacture, the BARC layer prevents the photo-resist layer from being exposed in the photolithographic process to "back"-radiation, i.e., the radiation being reflected by the substrate which would endanger the photolithographic definition quality.

Nevertheless, in prior art the BARC layer is commonly used in semiconductor device production lines in which the substrate is dry etched, for example by means of gas mixtures.

However, in the method according to the invention which provides instead a substrate "wet" etching, this material not only improves "deep UV" photo-resist material performances but it also prevents, due to its reduced "wettability", the diffusion of the acid solution used in the following semiconductor substrate etching in the portions thereof which are unexposed to this etching. Therefore, through the present invention a considerable improvement of the production process is achieved in terms of improved resolution and control of the critical size of circuit patterns formed on the semiconductor substrate.

Moreover, the BARC hydrophobic layer depositing step can be easily performed and it is advantageously suitable for an integration in the common photolithographic process thus achieving an equipment and production cost reduction.

The selective removing step of the ultraviolet-radiation-sensitive material layer is traditionally performed in the photolithographic process according to the reaction diagram shown in FIG. 1 and using an alkaline, watery solution for the photo-resist material development.

Also the hydrophobic material selective removing step is performed traditionally, preferably by plasma etching, for example with gas mixtures.

Preferably, the acid, watery solution used for etching the semiconductor substrate to be defined is a solution containing hydrofluoric acid (HF) and, optionally, ammonium fluoride ($NH_4F$) as buffer agent. The hydrofluoric acid concentration in the watery solution is generally comprised between 0.1% and 10%.

The hydrophobic material and photo-resist material removing steps after the etching step of the semiconductor substrate to be defined occur traditionally and preferably as previously mentioned with reference to the selective removal steps of these materials.

In an embodiment of the method according to the invention, the upper substrate 3 to be defined is formed of silicon oxide and it has a thickness of 30–1500 Å, the hydrophobic material layer 4 is formed of BARC and it has a thickness of 600–1600 Å and the "deep UV" photo-resist layer 5 has a thickness of 0.3–1.7 microns. The "deep UV" photo-resist layer 5 is selectively removed through traditional photolithography and the hydrophobic material layer 4 is selectively removed by plasma etching comprising a gas mixture of argon, oxygen and nitrogen.

Therefore, the exposed portions of the upper substrate 3 to be defined are chemically etched with a watery solution comprising 0.1–10% of hydrofluoric acid and layers 4 and 5, respectively of BARC and "deep UV" photo-resist material, are removed from the already defined upper substrate 3 unexposed portions as previously indicated with reference to the selective removal of these layers.

The main advantage of the method is that it allows semiconductor devices to be manufactured, even having a very critical size and with an adequate resolution and control of circuit patterns formed thereon through etching of the semiconductor substrate with acid, watery solutions. All this is obtained since in the electronic semiconductor device manufacturing method according to the invention, differently from known technologies, "deep UV" photo-resist material photolithography can be combined with the semiconductor substrate etching with watery acid solutions.

A further advantage of the method is its easy and economical implementation since it can be easily integrated in presently used semiconductor device production processes by means of a traditional equipment.

All of the above U.S. patents, U.S. patent application publications, U.S. patent applications, foreign patents, foreign patent applications and non-patent publications referred to in this specification and/or listed in the Application Data Sheet are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A method for manufacturing electronic semiconductor devices comprising the steps of:
    depositing a layer of hydrophobic material on a substrate;
    depositing a "deep UV" photo-resist layer on the layer of hydrophobic material;
    selectively removing said "deep UV" photo-resist layer in order to form an opening therein and expose a portion of said hydrophobic material;
    selectively removing said hydrophobic material in correspondence with the exposed portion thereof in order to expose a portion of said substrate;
    etching said substrate in correspondence with said exposed portion thereof through chemical etching with a watery acid solution; and
    removing said layer of hydrophobic material and said "deep UV" photo-resist layer from the unexposed portions of the semiconductor substrate.

2. A method according to claim 1, wherein said hydrophobic material is chosen from the group comprising BARC, polytetrafluoroethylene, polyethylene, polystyrene and polyvinyl chloride.

3. A method according to claim 2, wherein said hydrophobic material is BARC.

4. A method according to claim 1, wherein said layer of hydrophobic material has a thickness comprised between 300 Å and 1600 Å.

5. A method according to claim 1, wherein the selective removal of said "deep UV" photo-resist layer is performed through photolithography.

6. A method according to claim 1, wherein the selective removal of said layer of hydrophobic material is performed through plasma etching.

7. A method according to claim 1, wherein the watery solution used in the etching step of said semiconductor substrate comprises hydrofluoric acid with a concentration comprised between 0.1% and 10%.

8. A method according to claim 1, wherein said removing step of the hydrophobic material layer from semiconductor substrate unexposed portions is performed through plasma etching.

9. A method according to claim 1, wherein said removing step of the "deep UV" photo-resist layer from semiconductor substrate unexposed portions is performed through photolithography.

10. A method for manufacturing electronic semiconductor devices, comprising:
    depositing a hydrophobic layer directly on a semiconductor layer;
    depositing a photo-resist layer on the hydrophobic layer;
    selectively removing the photo-resist layer in order to form an opening therein and expose a portion of the hydrophobic layer;

selectively removing the hydrophobic layer in correspondence with the exposed portion thereof to expose a portion of the semiconductor layer;

etching the semiconductor layer in correspondence with the exposed portion of the semiconductor layer; and removing the layer of hydrophobic material and the photo-resist layer from the unexposed portions of the semiconductor layer.

11. The method of claim 10, wherein the hydrophobic layer is an organic material chosen from the group consisting of polymethylmethacrylate, polytetrafluoroethylene, polyethylene, polystyrene and polyvinyl chloride.

12. The method of claim 11 wherein the hydrophobic layer is polymethylmethacrylate.

13. The method of claim 10 wherein the hydrophobic layer has a thickness comprised between 300 Å and 1600 Å.

14. The method of claim 10 wherein the photo-resist layer is a "deep UV" photo-resist layer.

15. The method of claim 10 wherein selectively removing the hydrophobic layer is performed through plasma etching.

16. The method of claim 10 wherein removing the hydrophobic layer from the unexposed portions of semiconductor layer is performed through plasma etching.

17. The method of claim 10 wherein etching the substrate is performed by chemical etching with a watery acid solution.

18. A method for manufacturing an integrated device, comprising:

providing an intermediate structure, said intermediate structure including a semiconductor layer, a hydrophobic layer positioned on the semiconductor layer, and a photo-resist layer positioned on the hydrophobic layer;

providing an opening in the photo-resist layer to expose a portion of the hydrophobic layer; and providing an opening in the hydrophobic layer corresponding to the exposed portion thereof, that exposes a portion of the semiconductor layer.

19. The method of claim 18 wherein the intermediate structure further comprises a semiconductor substrate underlying the semiconductor layer, the exposed portion of the semiconductor layer being etched to expose a portion of the semiconductor substrate.

20. The method of claim 18 wherein the hydrophobic layer comprises a hydrophobic material selected from the group consisting of polymethylmethacrylate, polytetrafluoroethylene, polyethylene, polystyrene and polyvinyl chloride.

21. The method of claim 18 wherein the hydrophobic layer is positioned directly on the semiconductor layer, and the photo-resist layer is positioned directly on the hydrophobic layer.

* * * * *

UNITED STATES PATENT AND TRADEMARK OFFICE
CERTIFICATE OF CORRECTION

PATENT NO. : 7,064,075 B2 Page 1 of 1
APPLICATION NO. : 10/666918
DATED : June 20, 2006
INVENTOR(S) : Luigi Di Dio It is certified that error appears in the above-identified patent and that said Letters Patent is hereby corrected as shown below:

<u>Title Page: and Column 1,</u>
Item (54) "METHOD FOR MANUFACTURING SEMICONDUCTOR ELECTRONICS DEVICES" should read as --METHOD FOR MANUFACTURING SEMICONDUCTOR ELECTRONIC DEVICES--

<u>Column 6</u>
Line 40, "300 Åand 1600 Å" should read as --300 Å and 1600 Å--

<u>Column 7</u>
Line 16, "300 Åand 1600 Å" should read as --300 Å and 1600 Å--

Signed and Sealed this

Tenth Day of April, 2007

JON W. DUDAS
*Director of the United States Patent and Trademark Office*